(12) United States Patent
Chen et al.

(10) Patent No.: US 12,708,056 B2
(45) Date of Patent: Aug. 11, 2026

(54) FAN-OUT PACKAGING STRUCTURE AND METHOD FOR MANUFACTURING SAME

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 362 days.

(21) Appl. No.: 18/230,683

(22) Filed: Aug. 7, 2023

(65) Prior Publication Data

US 2024/0047326 A1 Feb. 8, 2024

(30) Foreign Application Priority Data

Aug. 8, 2022 (CN) ........................ 202210941380.3

(51) Int. Cl.
*H10W 90/00* (2026.01)
*H10W 70/05* (2026.01)
(Continued)

(52) U.S. Cl.
CPC ....... *H10W 90/701* (2026.01); *H10W 70/093* (2026.01); *H10W 74/012* (2026.01); *H10W 74/121* (2026.01); *H10W 74/15* (2026.01)

(58) Field of Classification Search
CPC ........... H01L 23/49816; H01L 23/5383; H01L 23/5385; H01L 23/3128; H01L 23/49811; H01L 23/49838; H01L 21/4853; H01L 21/563; H01L 21/3135; H01L 21/568; H01L 21/6835; H01L 21/0655; H01L 21/4846; H01L 25/50; H01L 25/0655; H01L 2221/68345; H01L 2224/16225; H01L 2224/32225; H01L 2224/73204; H01L 2224/81; H01L 2224/92125;
(Continued)

(56) References Cited

U.S. PATENT DOCUMENTS

2015/0257256 A1* 9/2015 Sato ..................... H05K 1/0269 257/774
2018/0151500 A1* 5/2018 Chen ................... H01L 23/5389
(Continued)

*Primary Examiner* — Marlon T Fletcher
*Assistant Examiner* — Christina A Sylvia
(74) *Attorney, Agent, or Firm* — IPRTOP LLC

(57) ABSTRACT

A fan-out packaging structure and a method for manufacturing the same are provided. The structure comprises: a fan-out substrate unit, and a secondary fan-out unit; an effective electrical connection between a second top surface of the fan-out substrate unit and a third bottom surface of the secondary fan-out unit is formed through a second solder array, and the fan-out substrate unit comprises a first wiring layer and a second wiring layer connected by conductive posts. By having a fan-out substrate unit with a double-layer wiring layer as the substrate of the fan-out wiring layer, the present disclosure reduces the achievable minimum line width, thereby increasing the achievable line density of the fan-out package. Meanwhile, replacing the traditional substrate with the double-layer wiring layer, and preparing the fan-out substrate unit and the secondary fan-out unit separately and then combining the two, shortens the time required to prepare the whole structure.

4 Claims, 9 Drawing Sheets

(51) Int. Cl.
*H10W 74/01* (2026.01)
*H10W 74/10* (2026.01)
*H10W 74/15* (2026.01)

(58) Field of Classification Search
CPC ... H01L 2924/181; H01L 2924/18161; H10W 90/701; H10W 70/093; H10W 74/012; H10W 74/121; H10W 74/15; H10W 90/00; H10W 72/072; H10W 70/611; H10W 70/685; H10W 90/401; H10W 72/073; H10W 74/00; H10W 74/019; H10W 74/117; H10W 74/142; H10W 90/724; H10W 90/734; H10W 70/05; H10W 70/65; H10P 72/7424; H10P 72/74
See application file for complete search history.

(56) References Cited

U.S. PATENT DOCUMENTS

2020/0152484 A1* 5/2020 Kwon ................. H01L 21/4857
2020/0381405 A1* 12/2020 Patil .................... H01L 21/6835

* cited by examiner

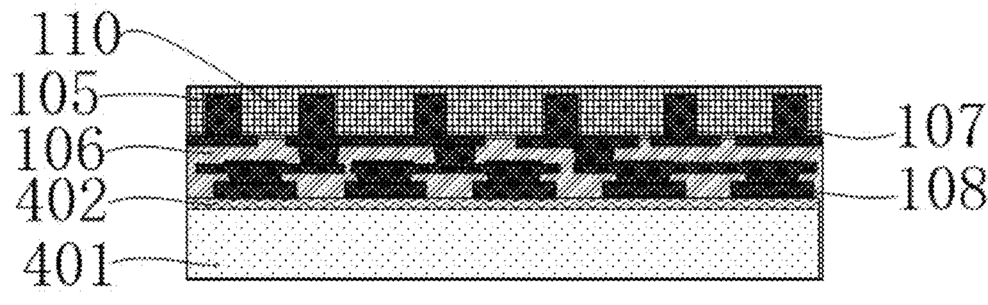
FIG. 5
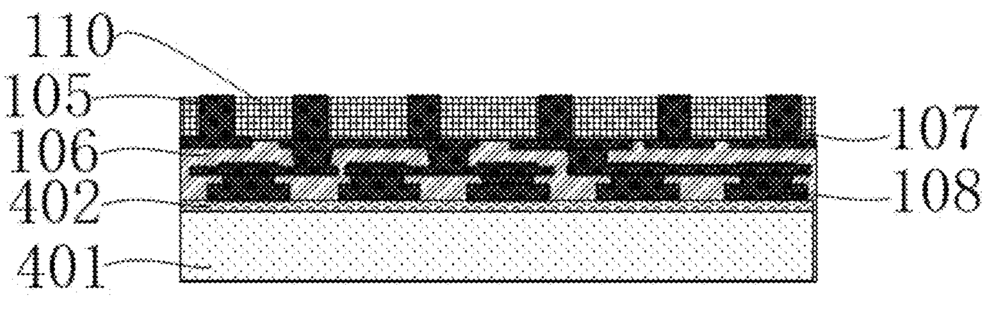
FIG. 6
FIG. 7

205
203
202
303
204
301
201
302
406
405
300

300
302
301
204
202
203
106
105
110
101
205
108
107
104
102
103

FAN-OUT PACKAGING STRUCTURE AND METHOD FOR MANUFACTURING SAME

CROSS REFERENCE TO RELATED APPLICATION

The present application claims the benefit of priority to Chinese Patent Application No. CN 202210941380.3, entitled "FAN-OUT PACKAGING STRUCTURE AND METHOD FOR MANUFACTURING SAME", filed with CNIPA on Aug. 8, 2022, the disclosure of which is incorporated herein by reference in its entirety for all purposes.

FIELD OF THE INVENTION

The present disclosure generally relates to semiconductor integrated circuit manufacturing, and in particular to a fan-out packaging structure and a method for manufacturing the same.

BACKGROUND OF THE INVENTION

As the semiconductor industry rapidly develops, there are increasingly more demanding requirements for the device features' line density and minimum size that packaging structures can achieve. This has led to the emergence of various advanced packaging technologies, one of which is fan-out packaging.

Fan-out packaging connects solder bumps and chips through a redistribution layer (RDL), allowing internal lines to be directly fanned out to the chips through the RDL. This achieves three-dimensional wire bonding and greatly reduces the minimum achievable line width of internal wires. However, when using the chip-last packaging method, a substrate is often required as a supporting structure. The use of a substrate makes it difficult to reduce the overall size of the fan-out packaging structure and increases manufacturing cycle time.

It should be noted that the above introduction to the technical background is only for providing a clear and complete explanation of the technical solution and facilitating understanding by technical personnels in this field. The above technical solutions should not be considered as known to technical personnels in this field simply because they are described in this application's background section.

SUMMARY

The present disclosure provides a fan-out packaging structure, comprising a fan-out substrate unit and a secondary fan-out unit, wherein the fan-out substrate unit comprises a first solder array, a first wiring layer, conductive posts, a second wiring layer, an oxidation-resistant layer, and a first encapsulation layer, wherein the first wiring layer comprises a first bottom surface and a first top surface opposite to the first bottom surface, and the first solder array is provided over the first bottom surface, wherein the second wiring layer comprises a second bottom surface and a second top surface opposite to the second bottom surface, wherein an effective electrical connection between the first top surface and the second bottom surface is formed through the conductive posts, wherein the oxidation-resistant layer is formed over the second top surface, wherein the first encapsulation layer fills gaps between the first top surface and the second bottom surface, and encapsulates the conductive posts, wherein the secondary fan-out unit comprises a second encapsulation layer, a third wiring layer, and a second solder array, wherein the third wiring layer comprises a third bottom surface and a third top surface opposite to the third bottom surface, wherein the second solder array is provided between the second top surface and the third bottom surface, wherein the second encapsulation layer encapsulates the secondary fan-out unit to form an encapsulation body.

The present disclosure also provides a method for manufacturing a fan-out packaging structure, comprising: providing a first temporary substrate; forming a first separation layer on the first temporary substrate; forming a second wiring layer on the first separation layer, wherein the second wiring layer comprises a second bottom surface and a second top surface opposite to the second bottom surface, and the first separation layer is in contact with the second top surface; forming a plurality of conductive posts over the second bottom surface; filling gaps between the plurality of conductive posts with a first encapsulation layer; grinding the first encapsulation layer until bottom surfaces of the conductive posts are exposed; forming a first wiring layer over the first encapsulation layer, wherein the first wiring layer comprises a first bottom surface and a first top surface opposite to the first bottom surface, wherein an effective electrical connection is formed between the first top surface and the plurality of conductive posts; disposing a first solder array over the first bottom surface, wherein the first solder array is electrically connected to the first bottom surface; removing the first temporary substrate by removing the first separation layer; forming an oxidation-resistant layer over the first bottom surface, after which step a fan-out substrate is obtained; cutting the fan-out substrate to form a plurality of fan-out substrate units; providing a second temporary substrate, forming a second separation layer on the second temporary substrate; forming a third wiring layer over the second separation layer, wherein the third wiring layer comprises a third bottom surface and a third top surface opposite to the third bottom surface, wherein the third bottom surface is in contact with the second separation layer; removing the second temporary substrate by removing the second separation layer; forming a second solder array over the third bottom surface, wherein the second solder array is electrically connected to the third bottom surface, after which step a secondary fan-out structure is obtained; cutting the secondary fan-out structure to form a plurality of secondary fan-out units; and fixing and electrically connecting the third bottom surface to the second top surface through the second solder array.

By having a fan-out substrate unit with a double-layer wiring layer as the substrate of the fan-out wiring layer, the present disclosure reduces the minimum line width that can be achieved by the fan-out circuit, thereby increasing the achievable line density of the fan-out package and reducing the size of the fan-out package. Meanwhile, replacing the traditional substrate with the double-layer wiring layer, and adopting the centralized preparation method which prepares the fan-out substrate unit and the secondary fan-out unit separately first and combining the two after, can shorten the time required to prepare the entire structure and improve the production efficiency.

BRIEF DESCRIPTION OF THE DRAWINGS

FIG. 5 is a schematic diagram showing an intermediate structure obtained after filling gaps between conductive posts with a first encapsulation layer in Embodiment 2 of the present disclosure.

FIG. 6 is a schematic diagram showing an intermediate structure obtained after grinding the first encapsulation layer to expose the conductive posts in Embodiment 2 of the present disclosure.

FIG. 7 is a schematic diagram showing an intermediate structure obtained after forming a first wiring layer over the first encapsulation layer in Embodiment 2 of the present disclosure.

REFERENCE NUMERALS

Figure 1:
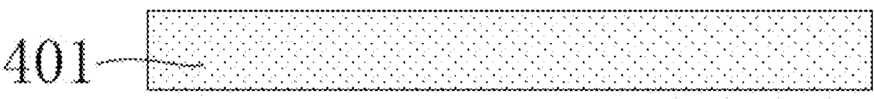
FIG. 1 is a schematic diagram showing a first temporary substrate provided in step 1 of Embodiment 2 of the present disclosure.

101, first solder array; 102, first wiring layer; 103, first bottom surface; 104, first top surface; 105, conductive posts; 106, second wiring layer; 107, second bottom surface; 108, second top surface; 109, oxidation-resistant layer; 110, first encapsulation layer;

201, second encapsulation layer; 202, third wiring layer; 203, third bottom surface; 204, third top surface; 205, second solder array; 206, first filler layer;

300, semiconductor chip set; 301, solder surface; 302, external connection surface; 303, second filler layer; and

401, first temporary substrate; 402, first separation layer; 403, second temporary substrate; 404, second separation layer; 405, third temporary substrate; 406, third separation layer; 407, support layer; 408, heat sink.

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

When describing the embodiments of the present invention, for the sake of explanation, schematic diagrams representing the device structure may be partially enlarged without following the general scale. Moreover, the schematic diagrams are only examples and should not limit the scope of protection of the present invention. In addition, the actual production should include the length, width, and depth of the three-dimensional space dimensions.

For the convenience of description, spatial relation terms such as “below”, “under”, “beneath”, “on”, “above”, “up”, etc. may be used herein to describe the relationships between an element or feature and other elements or features. It will be understood that these spatial relationship terms are intended to encompass directions/orientations of the device in use or operation other than those depicted in the drawings.

In the context of this disclosure, the structure described with a first feature on or over a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

As shown in FIGS. 1-23, the present disclosure provides a fan-out packaging structure, which includes: a fan-out substrate unit and a secondary fan-out unit.

The fan-out substrate unit includes a first solder array 101, a first wiring layer 102, conductive posts 105, a second wiring layer 106, an oxidation-resistant layer 109, and a first encapsulation layer 110; the first wiring layer 102 includes a first bottom surface 103 and a first top surface 104 opposite to the first bottom surface; the first solder array 101 is provided on the first bottom surface 103; the second wiring layer 106 includes a second bottom surface 107 and a second top surface 108 opposite to the second bottom surface; the first top surface 104 and the second bottom surface 107 are electrically connected by the conductive posts 105; the oxidation-resistant layer 109 is provided on the second top surface 108; and the first encapsulation layer 110 fills gaps between the first top surface 104 and the second bottom surface 107, encapsulating the conductive posts 105.

The secondary fan-out unit includes a second encapsulation layer 201, a third wiring layer 202, and a second solder array 205; the third wiring layer 202 includes a third bottom surface 203 and a third top surface 204 opposite to the third bottom surface 203; the second solder array 205 is provided between the second top surface 108 and the third bottom surface 203; and the second encapsulation layer 201 encapsulates the secondary fan-out unit to form an encapsulation body.

In related technology, when using the chip-last packaging method in fan-out packaging, a substrate is often required as a support for the redistribution layer (RDL). However, the line density that the substrate itself can achieve is relatively low, which limits the minimum line width and line spacing that the overall fan-out package can achieve. The present disclosure replaces this kind of substrate with a fan-out substrate unit with a double-layer RDL, using the internal interconnection characteristics of the RDL to increase the line density that can be achieved by fan-out packaging, thereby reducing the size of fan-out packaging, and increasing its integration.

In addition, compared to traditional fan-out packaging where RDLs are made on substrates, double-layer RDL fan-out substrate units and single-layer RDL secondary fan-out units can be made separately and then combined for packaging, and the intermediate and back-end processes can be centralized, greatly reducing the manufacturing time of fan-out packaging, and improving its production efficiency. At the same time, the various interconnection manners of RDLs provide compatibility with different chips and components, improving the system-level packaging capabilities of the fan-out packaging.

Optionally, both the fan-out substrate unit and the secondary fan-out unit can include single or multi-layer RDL structures according to actual needs. Multiple layers of RDLs can be interconnected through conductive vias or by solder arrays or other appropriate methods.

Optionally, a material of the first solder array 101 or/and the second solder array 205 is one of copper, nickel, gold, silver, tin, and carbon nanotubes.

As an example, the first encapsulation layer 110 also encapsulates the first wiring layer 102 and the second wiring layer 106, filling gaps between the first bottom surface 103 and the second top surface 108. The present disclosure improves the strength of the packaging structure by fully encapsulating the first wiring layer 102 and the second wiring layer 106 with the first encapsulation layer 110, which is conducive to improving the interference resistance and reliability of the fan-out packaging structure.

Specifically, a material of the first encapsulation layer 110 is epoxy resin. Optionally, the epoxy resin is a thermosetting epoxy resin or a thermoplastic epoxy resin.

As an example, the fan-out packaging structure also includes a first filler layer 206, filling gaps inside and around the second solder array 205. Specifically, the first filler layer 206 fills gaps between solder bumps in the second solder array 205 and around the solder bumps so that the individual solder bumps are not electrically connected to each other. Specifically, the first filler layer 206 may include one of an epoxy resin layer, a polyimide layer, and a silicone layer. In the present disclosure, gaps are filled with an insulating filler layer to enhance the bonding effect between the fan-out substrate unit and the secondary fan-out unit, forming a protective layer to prevent vapor, oxygen, etc. from acting on the second top surface 108 of the fan-out substrate unit and the third bottom surface 203 of the secondary fan-out unit, and preventing short-circuiting between adjacent solder bumps in the second solder array 205, improving the performance reliability of the fan-out packaging structure.

As an example, the fan-out packaging structure also includes a semiconductor chip set 300, which may include multiple chips and is provided on the third top surface 204 of the secondary fan-out unit; each of the chips in the semiconductor chip set 300 includes a solder surface 301 and an external connection surface 302 opposite to the solder surface 301; the solder surface 301 of the semiconductor chip set 300 and the third top surface 204 of the third wiring layer 202 are electrically connected through an electrical connection structure. Gaps of the electrical connection structure between the semiconductor chip set 300 and the third top surface 204 are filled by a second filler layer 303; the encapsulation body encapsulates the secondary fan-out unit, the semiconductor chip set 300, and the electrical connection structure. In the present disclosure, the gaps of the electrical connection structure between the semiconductor chip set 300 and the third top surface 204 are filled with the second filling layer 303 to prevent mechanical fatigue caused by temperature changes during the use of the fan-out packaging structure due to the different thermal expansion coefficients of the semiconductor chip set 300 and the RDLs, effectively preventing solder joint detachment or fracture, while reducing interference that may occur between different semiconductor chips and components in the semiconductor chip set 300.

As an example, the first wiring layer 102, the second wiring layer 106, and the third wiring layer 202 each include a plurality of circuit layers and a plurality of dielectric layers alternately formed, and conductive through-holes, communicating two adjacent circuit layers.

Optionally, materials of the first wiring layer, the second wiring layer, or/and the third wiring layer include one or more of copper, aluminum, titanium, gold, silver, and nickel.

As an example, among the circuit layers, the one located on the third top surface 204 has a line width of 1.5 microns to 5 microns and a line spacing of 1.5 microns to 5 microns. Specifically, both the line width and the line spacing can be adjusted according to specific needs. Through the introduction of a double-layer RDL structure, the present disclosure enables the line width and line spacing of the circuit layers to reach dimensions close to the minimum limit of existing RDL technology, that is, 1.5 microns.

As an example, the line width and line spacing of each circuit layer of the third wiring layer 202 are gradually reduced along the direction from the third top surface 204 to the third bottom surface 203.

Embodiment 2

The present disclosure provides a method for manufacturing a fan-out packaging structure, and the method includes Steps 1 to 7 as described below.

Step 1: providing a first temporary substrate 401; forming a first separation layer 402 on the first temporary substrate 401; forming a second wiring layer 106 on the first separation layer 402, wherein the second wiring layer 106 includes a second bottom surface 107 and a second top surface 108 opposite to the second bottom surface 107, and the first separation layer 402 is in contact with the second top surface 108;

Step 2: forming a plurality of conductive posts 105 over the second bottom surface 107; filling gaps between the plurality of conductive posts 105 with a first encapsulation layer 110; grinding the first encapsulation layer 110 until bottom surfaces of the conductive posts 105 are exposed; forming a first wiring layer 102 over the first encapsulation layer 110, wherein the first wiring layer 102 includes a first bottom surface 103 and a first top surface 104 opposite to the first bottom surface 103, wherein an effective electrical connection is formed between the first top surface 104 and the plurality of conductive posts 105;

Step 3: disposing a first solder array 101 over the first bottom surface 103, wherein the first solder array 101 is electrically connected to the first bottom surface 103; removing the first temporary substrate 401 by removing the first separation layer 402; forming an oxidation-resistant layer 109 over the second top surface 108, after which step a fan-out substrate is obtained; cutting the fan-out substrate to form a plurality of fan-out substrate units;

Step 4: providing a second temporary substrate 403, forming a second separation layer 404 on the second temporary substrate 403; forming a third wiring layer 202 over the second separation layer 404, wherein the third wiring layer 202 includes a third bottom surface 203 and a third top surface 204 opposite to the third bottom surface 203, wherein the third bottom surface 203 is in contact with the second separation layer 404;

Step 5: removing the second temporary substrate 403 by removing the second separation layer 404;

Step 6: forming a second solder array 205 over the third bottom surface 203, wherein the second solder array 205 is electrically connected to the third bottom surface 203, after which step a secondary fan-out structure is obtained; cutting the secondary fan-out structure to form a plurality of secondary fan-out units; and Step 7: fixing and electrically connecting the third bottom surface 203 to the second top surface 108 through the second solder array 205.

The following will describe in detail the method for manufacturing the fan-out package structure of the present invention with reference to the accompanying drawings. It should be noted that the order mentioned above does not strictly limit the sequence of manufacturing steps for the fan-out packaging structure of the present disclosure. Technical personnel in this field can make changes based on actual preparation steps.

Figure 2:
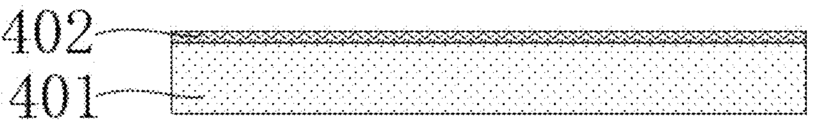
FIG. 2 is a schematic diagram showing an intermediate structure obtained after forming a first separation layer on a first temporary substrate in Embodiment 2 of the present disclosure.
Figure 3:
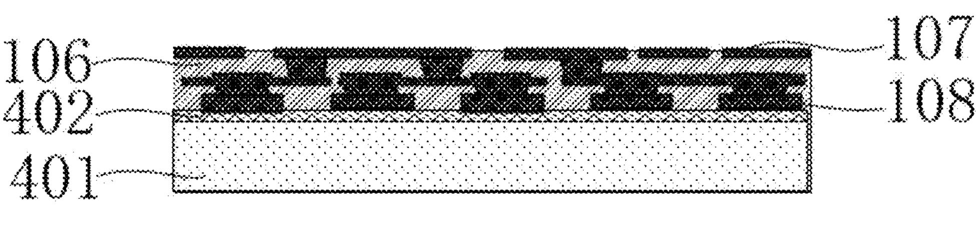
FIG. 3 is a schematic diagram showing an intermediate structure obtained after forming a second wiring layer on a first separation layer in Embodiment 2 of the present disclosure.
Figure 4:
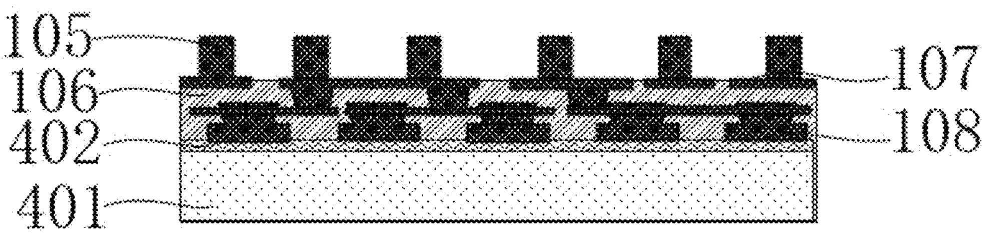
FIG. 4 is a schematic diagram showing an intermediate structure obtained after forming conductive posts in Embodiment 2 of the present disclosure.

First, as shown in FIGS. 1-3, Step 1 is performed by providing a first temporary substrate 401; forming a first separation layer 402 on the first temporary substrate 401; forming a second wiring layer 106 on the first separation layer 402, wherein the second wiring layer 106 includes a second bottom surface 107 and a second top surface 108 opposite to the second bottom surface 107, and the first separation layer 402 is in contact with the second top surface 108.

Specifically, the second wiring layer 106 includes a second circuit layer and a second dielectric layer. Optionally, the conductive posts 105 are formed after etching the second bottom surface 107 of the second wiring layer 106 by laser etching to expose the second circuit layer on the second bottom surface 107.

Then, as shown in FIGS. 4-7, Step 2 is performed by forming a plurality of conductive posts 105 over the second bottom surface 107; filling gaps between the plurality of conductive posts 105 with a first encapsulation layer 110; polishing/grinding the first encapsulation layer 110 until bottom surfaces of the conductive posts 105 are exposed; forming a first wiring layer 102 over the first encapsulation layer 110, wherein the first wiring layer 102 includes a first bottom surface 103 and a first top surface 104 opposite to the first bottom surface 103, wherein an effective electrical connection is formed between the first top surface 104 and the plurality of conductive posts 105.

Specifically, the first wiring layer 102 includes a first circuit layer and a first dielectric layer. Optionally, the first solder array 101 is disposed after etching the first bottom surface 103 by laser etching to expose the first circuit layer on the first bottom surface 103.

Optionally, the first encapsulation layer 110 is formed by one of compression molding, transfer molding, liquid encapsulation adhesive molding, vacuum lamination, and spin coating.

Optionally, a specific method for forming the conductive posts 105 include: forming through-holes by laser drilling or deep ion etching (DRIE); depositing an intermediate dielectric layer by thermal oxidation or plasma enhanced chemical vapor deposition (PECVD); depositing a barrier layer and a seed layer by physical vapor deposition (PVD); covering the through-holes with a conductive material by plating or PVD; performing chemical mechanical polishing (CMP) on the conductive material. The above method can also be adapted to specific needs.

Optionally, the conductive material used above is one or more of gold, silver, aluminum, copper, titanium, tungsten, polysilicon, and other suitable conductive materials.

The present disclosure achieves a three-dimensional connection by connecting double-layer RDLs through conductive posts 105 in a way that occupies less area of the fan-out substrate unit and has the shortest pathway between the double-layer RDLs. This kind of short-pathway connection reduces parasitic capacitance and inductance, allowing the fan-out packaging structure to achieve less power consumption and greater bandwidth, while reducing signal delay.

Figure 8:
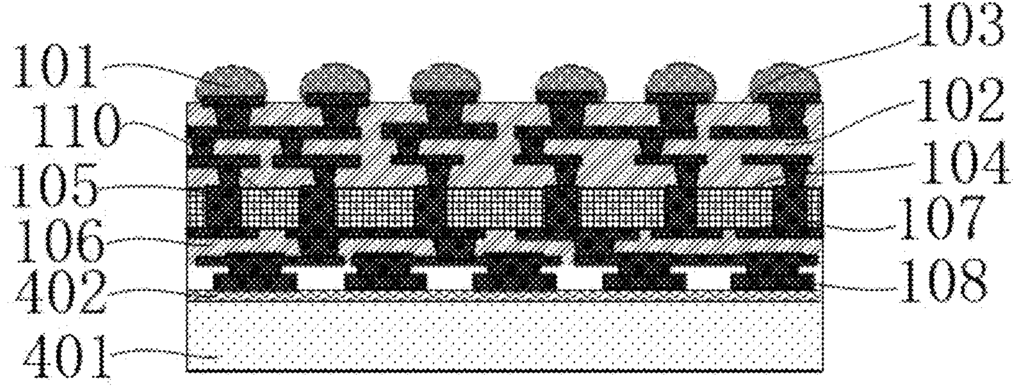
FIG. 8 is a schematic diagram showing an intermediate structure obtained after disposing a first solder array over a first bottom surface in Embodiment 2 of the present disclosure.
Figure 11:
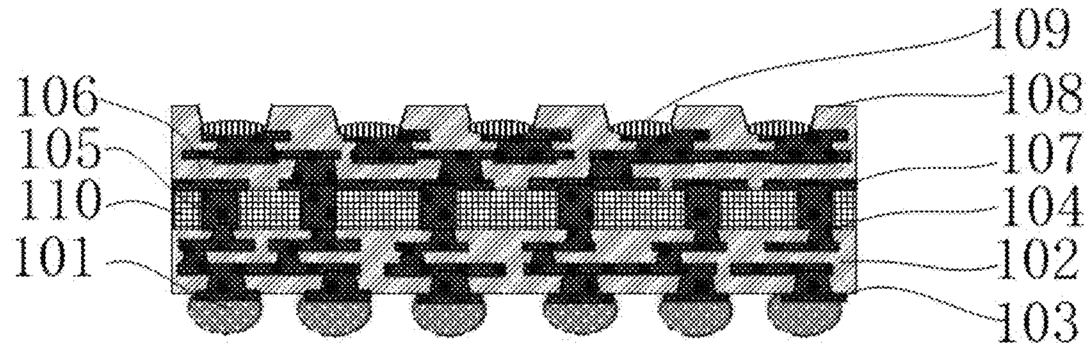
FIG. 11 is a schematic diagram showing an intermediate structure obtained after removing the support layer in Embodiment 2 of the present disclosure.

Next, as shown in FIG. 8 and FIG. 11, Step 3 is performed by: disposing a first solder array 101 over the first bottom surface 103, wherein the first solder array 101 is electrically connected to the first bottom surface 103; removing the first temporary substrate 401 by removing the first separation layer 402; forming an oxidation-resistant layer 109 over the second top surface 108, after which step a fan-out substrate is obtained; cutting the fan-out substrate to form a plurality of fan-out substrate units.

Optionally, a material of the oxidation-resistant layer 109 is copper or tin. Before proceeding to Step 7, it is necessary to confirm whether the material of the oxidation-resistant layer 109 has completely dried, and if it has not completely dried, excessive anti-oxidation materials can be removed by reflow soldering with flux.

Figure 9:
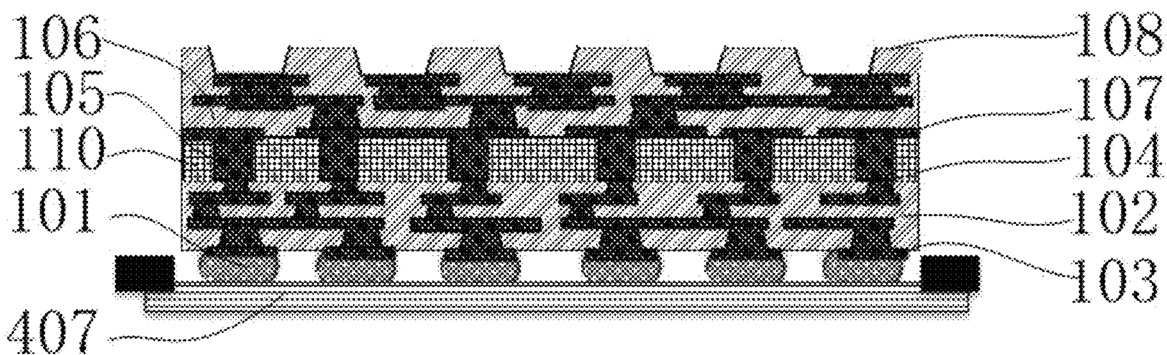
FIG. 9 is a schematic diagram showing an intermediate structure obtained after forming a support layer over the first solder array in Embodiment 2 of the present disclosure.
Figure 10:
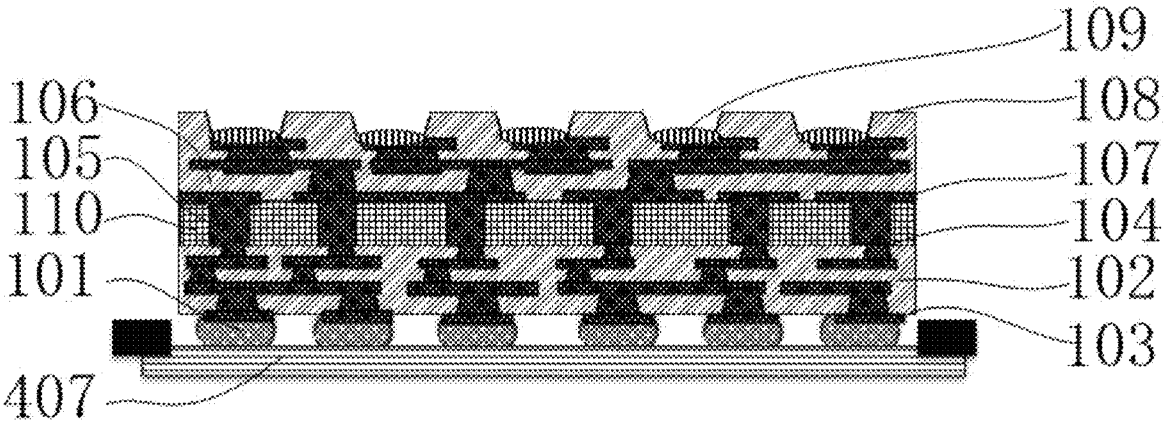
FIG. 10 is a schematic diagram showing an intermediate structure obtained after forming an oxidation-resistant layer in Embodiment 2 of the present disclosure.

Optionally, as shown in FIGS. 9-11, the method further includes: forming a support layer 407 on a side of the first temporary substrate 401 facing away from the second top surface 108 after the first temporary substrate 401 is removed; after forming the oxidation-resistant layer 109 and cutting the fan-out substrate to obtain the fan-out substrate units, removing the support layer 407.

Figure 12:
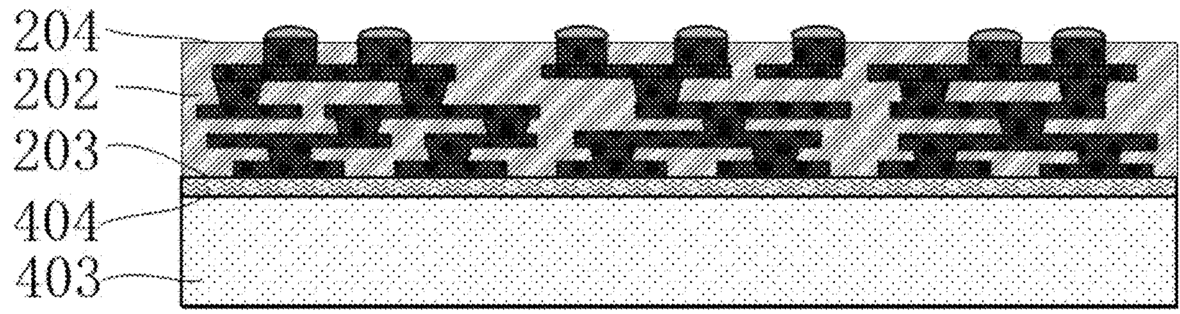
FIG. 12 is a schematic diagram showing an intermediate structure obtained after forming a second separation layer and a third wiring layer on the second temporary substrate in Embodiment 2 of the present disclosure.
Figure 13:
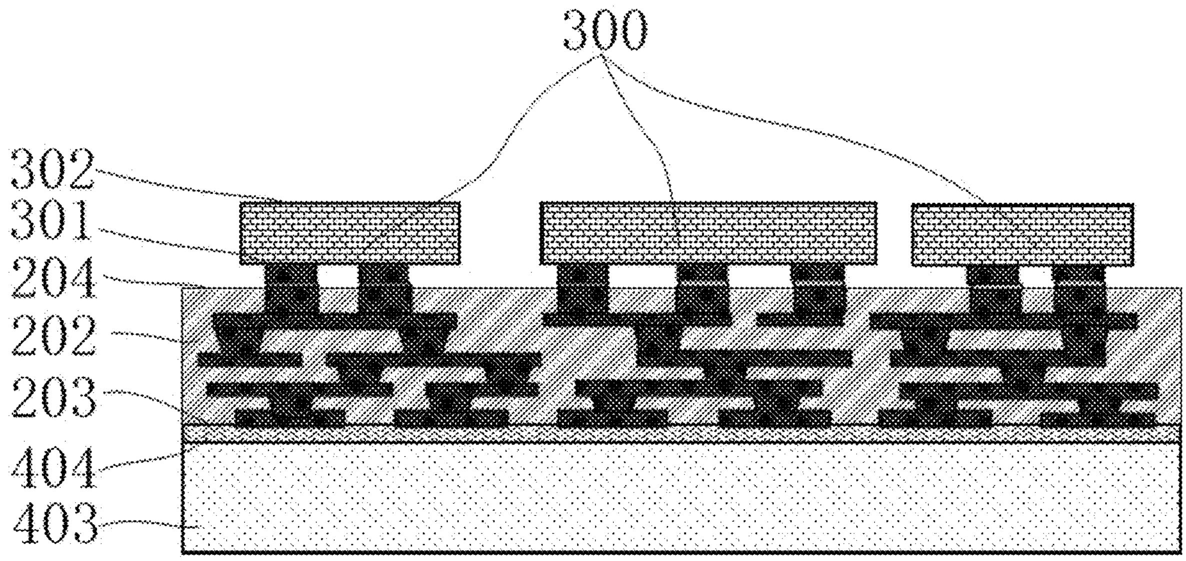
FIG. 13 is a schematic diagram showing an intermediate structure obtained after disposing a semiconductor chip set over a third top surface in Embodiment 2 of the present disclosure.
Figure 14:
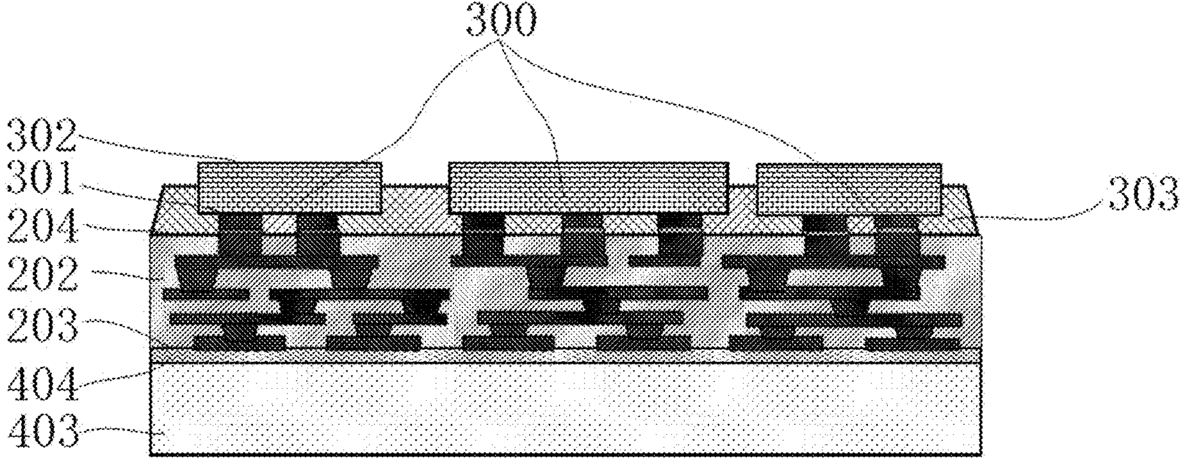
FIG. 14 is a schematic diagram showing an intermediate structure obtained after filling gaps inside an electrical connection structure with a second filler layer in Embodiment 2 of the present disclosure.
Figure 15:
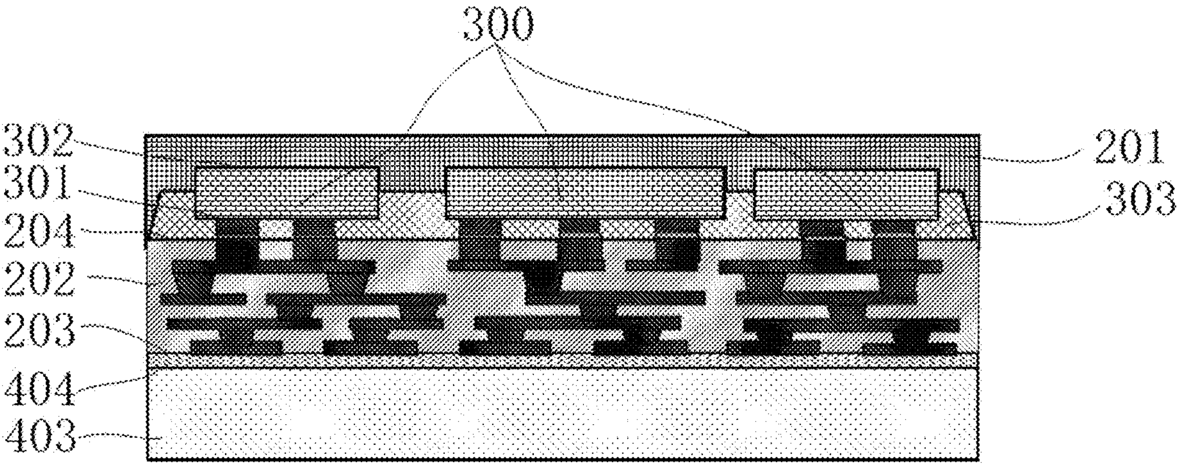
FIG. 15 is a schematic diagram showing an intermediate structure obtained after filling gaps in a semiconductor chip set with a second encapsulation layer in Embodiment 2 of the present disclosure.
Figure 16:
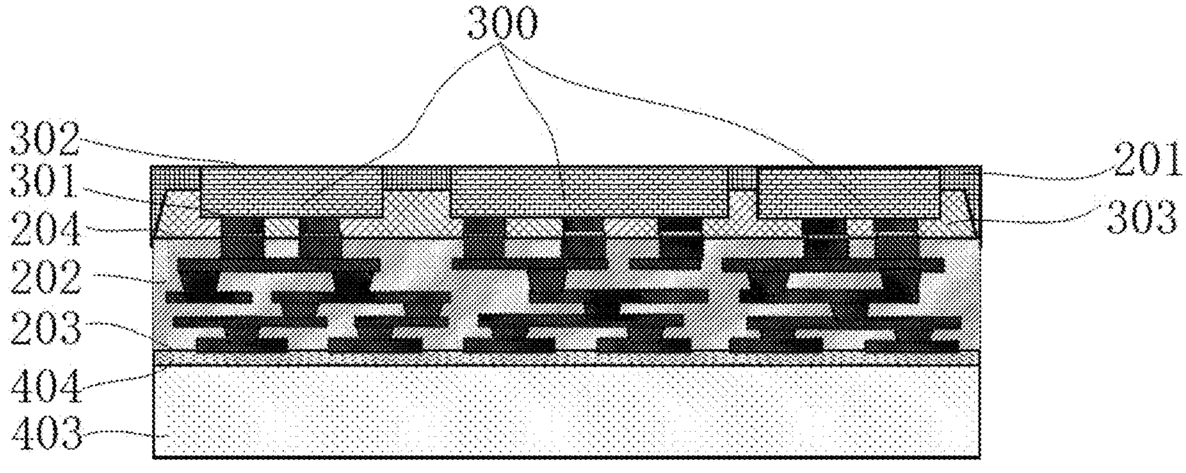
FIG. 16 is a schematic diagram showing an intermediate structure obtained after grinding the second encapsulation layer to expose an external connection surface in Embodiment 2 of the present disclosure.
Figure 17:
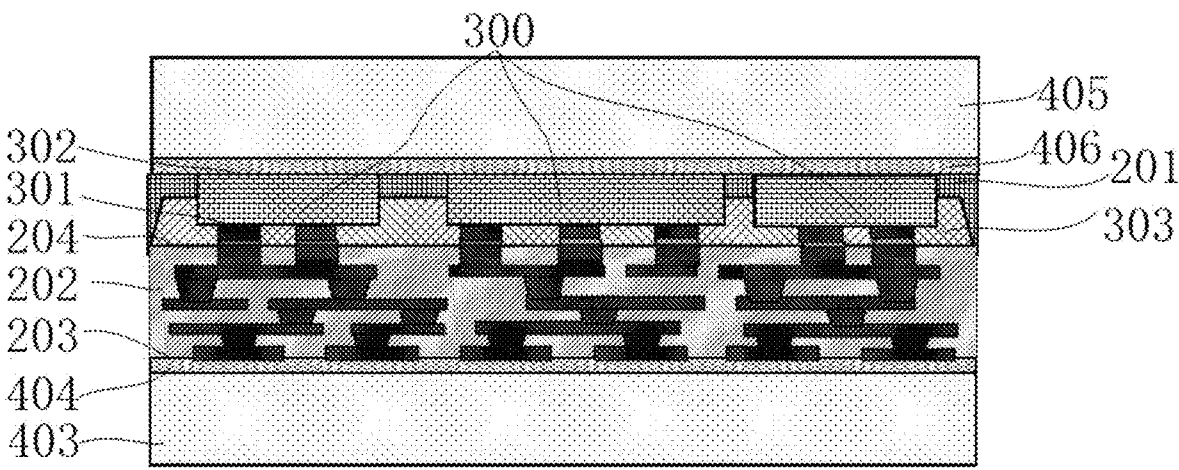
FIG. 17 is a schematic diagram showing an intermediate structure obtained after mounting a third separation layer and a third temporary substrate on an external connection surface in Embodiment 2 of the present disclosure.
Figures 18, 19:
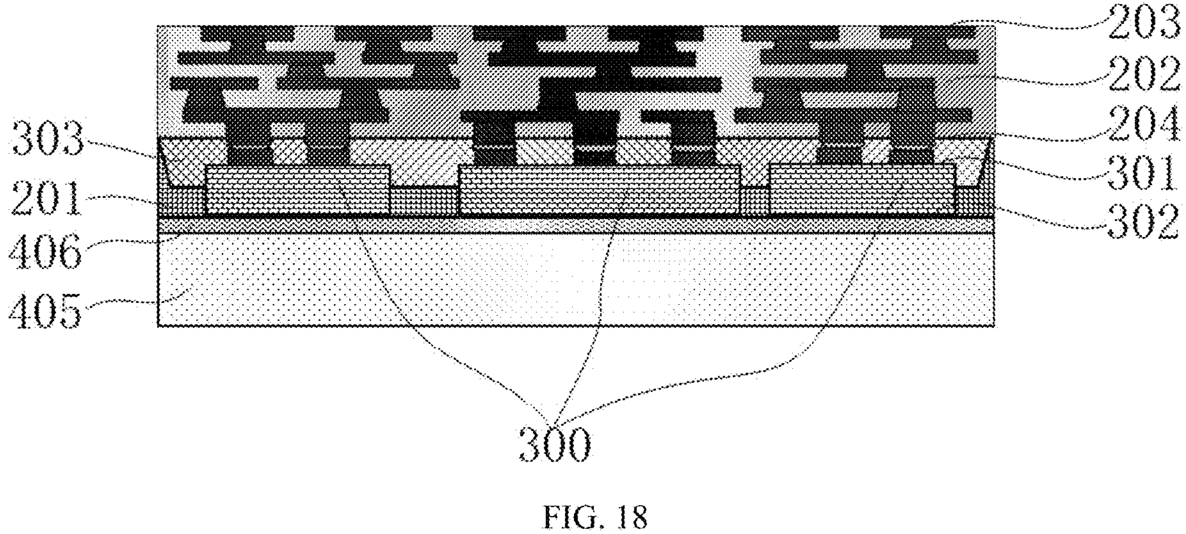
FIG. 18 is a schematic diagram showing an intermediate structure obtained after removing the second temporary substrate in Embodiment 2 of the present disclosure.
FIG. 19 is a schematic diagram showing an intermediate structure obtained after forming a second solder array over a bottom surface in Embodiment 2 of the present disclosure.

Then, as shown in FIG. 12, Step 4 is performed by providing a second temporary substrate 403, forming a second separation layer 404 on the second temporary substrate 403; forming a third wiring layer 202 over the second separation layer 404, wherein the third wiring layer 202 includes a third bottom surface 203 and a third top surface 204 opposite to the third bottom surface 203, wherein the third bottom surface 203 is in contact with the second separation layer 404.

Specifically, the third wiring layer 202 includes a third circuit layer and a third dielectric layer. Optionally, the third wiring layer 202 is first formed and then its third top surface 204 is etched by laser to expose the third circuit layer on the third top surface 204 of the third wiring layer 202.

Optionally, the first circuit layer, the second circuit layer, or/and the third circuit layer are formed by one of physical vapor deposition, chemical vapor deposition, sputtering, electroplating, and chemical plating.

Then, Step 5 is performed by removing the second temporary substrate 403 by removing the second separation layer 404.

Next, Step 6 is performed by forming a second solder array 205 over the third bottom surface 203, wherein the second solder array 205 is electrically connected to the third bottom surface 203, after which step a secondary fan-out structure is obtained; cutting the secondary fan-out structure to form a plurality of secondary fan-out units.

Specifically, the first solder array 101 or/and the second solder array 205 is prepared by one of electrochemical deposition, electroplating, sputtering, and vapor deposition.

Optionally, the first solder array 101 and/or the second solder array 205 can be distributed only around the periphery of the object to be soldered using a conventional flip-chip on board (FCOB) method, or solder balls can be formed using a controlled collapse chip connection (C4) method, or solder caps can be formed on solder posts using an ultra-fine pitch dedicated chip connection (C2) method. C2 can achieve a smaller solder unit pitch, i.e., a larger solder array density, providing for the density of 10 ports, without increasing the risk of short-circuiting. However, since the solder bumps are in the form of solder caps in C2, the surface tension is not sufficient to achieve the self-alignment with the solder posts, so the self-alignment ability of C2's solder bumps is lower than that of C4. Practitioners need to weigh and choose the actual soldering method for the solder arrays based on their requirements for 10 port density and solder position accuracy.

Figures 20, 21:
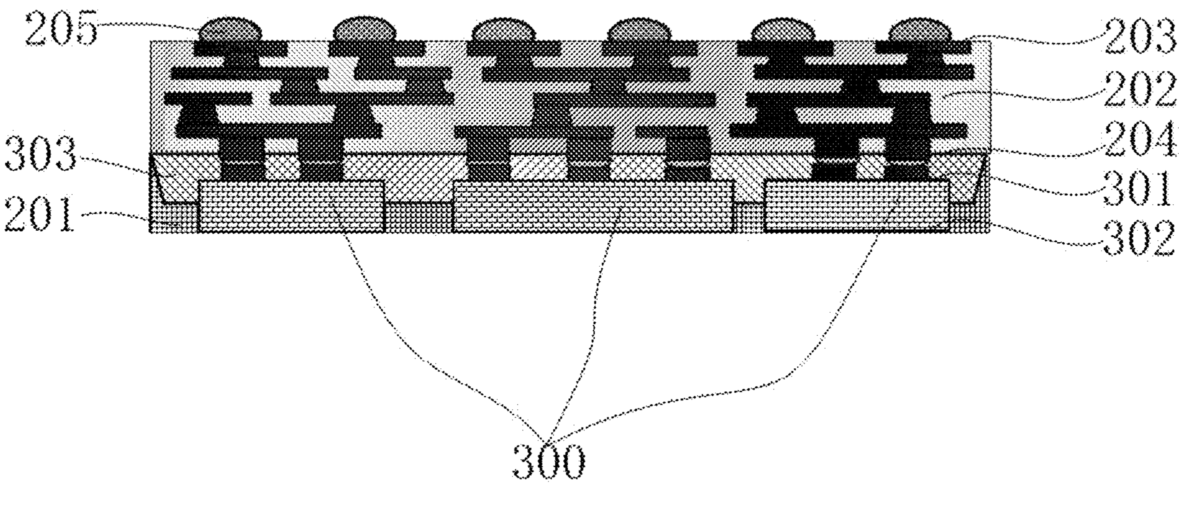
FIG. 20 is a schematic diagram showing an intermediate structure obtained after removing the third temporary substrate in Embodiment 2 of the present disclosure.
FIG. 21 is a schematic structural diagram of a fan-out packaging structure having the secondary fan-out unit attached to the fan-out substrate unit in Embodiment 2 of the present disclosure.

Finally, as shown in FIG. 21, Step 7 is performed by fixing and electrically connecting the third bottom surface 203 to the second top surface 108 through the second solder array 205.

In related technology, fan-out packaging using the chip-last method also retains a substrate, but during the manufacturing process, the substrate itself serves as a supporting structure for the entire manufacturing process, causing the internal circuit structure of the substrate itself to be subjected to certain pressure, resulting in instability of the internal circuit of the substrate. In the present disclosure, other structures are prepared on the first temporary substrate 401, the second temporary substrate 403, and the third temporary substrate 405. After the above preparation is completed, the first temporary substrate 401, the second temporary substrate 403, and the third temporary substrate 405 are removed by de-bonding. The secondary fan-out unit and the fan-out substrate unit are prepared separately and then stacked together and connected, which ensures that during the preparation process, the two structures will not be affected by external pressure and thus the two structures can maintain their circuit reliability, thereby improving the production yield of the fan-out packaging structure.

Optionally, as shown in FIGS. 13-20, the method further includes: after forming the third wiring layer 202, disposing a semiconductor chip set 300 over the third top surface 204, wherein the semiconductor chip set 300 includes a solder surface 301 and an external connection surface 302, wherein an effective electrical connection between the solder surface 301 and the third top surface 204 is formed by an electrical connection structure; filling gaps inside the electrical connection structure by a second filler layer 303; encapsulating the semiconductor chip set 300 with a second encapsulation layer 201 to form an encapsulation body, wherein the second encapsulation layer 201 encapsulates the third wiring layer 202, the semiconductor chip set 300, and the electrical connection structure; grinding the second encapsulation layer 201 until the external connection surface of the semiconductor chip set 300 is exposed; forming a third separation layer 406 over the external connection surface, providing a third temporary substrate 405 on the third separation layer 406; removing the second temporary substrate 403 by removing the second separation layer 404; forming a second solder array 205 over the third bottom surface 203, wherein the second solder array 205 is electrically connected to the third bottom surface 203; after the second solder array 205 is formed over the third bottom surface 203, removing the third temporary substrate 405 by removing the third separation layer 406, thereby obtaining a secondary fan-out structure. Specifically, a material of the second encapsulation layer 303 is epoxy resin.

Optionally, the second encapsulation layer 201 is formed by one of compression molding, transfer molding, liquid encapsulation adhesive molding, vacuum lamination, and spin coating.

Optionally, the semiconductor chip set 300 includes chips or components that are one or more of a capacitor, an inductor, a resistor, a transistor switch, a millimeter wave antenna, a graphics processor, a power management unit, a dynamic random memory, a flash memory, and a filter.

Optionally, materials of the first temporary substrate 401, the second temporary substrate 403, and the third temporary substrate 405 may be one of glass, metal, semiconductor, polymer, and ceramic. Preferably, the materials of the first temporary substrate 401, the second temporary substrate 403, and the third temporary substrate 405 are glass. Glass is less costly, and it is easy to form a separation layer on its surface, and then to peel the separation layer off its surface.

Preferably, the first temporary substrate 401, the second temporary substrate 403, and the third temporary substrate 405 are square wafers, or 12-inch or 8-inch round wafers.

Optionally, materials of the first separation layer 402, the second separation layer 404, and the third separation layer 406 are polymer. Specifically, the first separation layer 402, the second separation layer 404, and the third separation layer 406 are formed on the first temporary substrate 401, the second temporary substrate 403, and the third temporary substrate 405 by spin coating processes, respectively.

Figure 22:
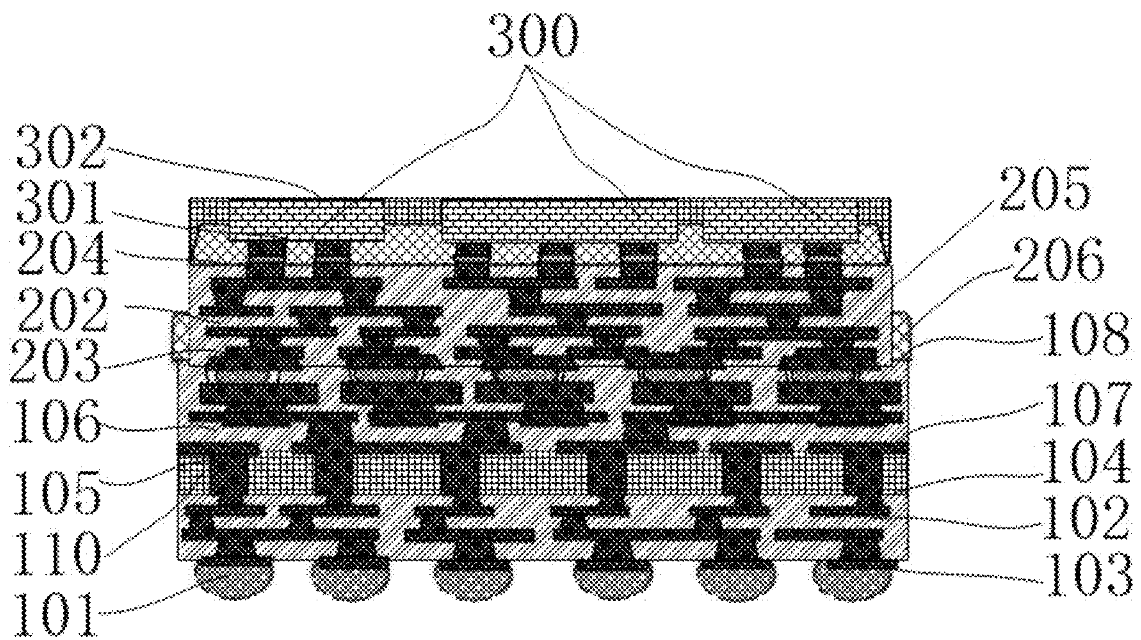
FIG. 22 is a schematic structural diagram of a fan-out packaging structure, where gaps in the second solder array are filled with a first filler layer in Embodiment 2 of the present disclosure.

Optionally, as shown in FIG. 22, the fan-out packaging structure also includes a first filler layer 206, filling gaps inside and around the second solder array 205. Specifically, a material of the first encapsulation layer 206 is epoxy resin.

Figure 23:
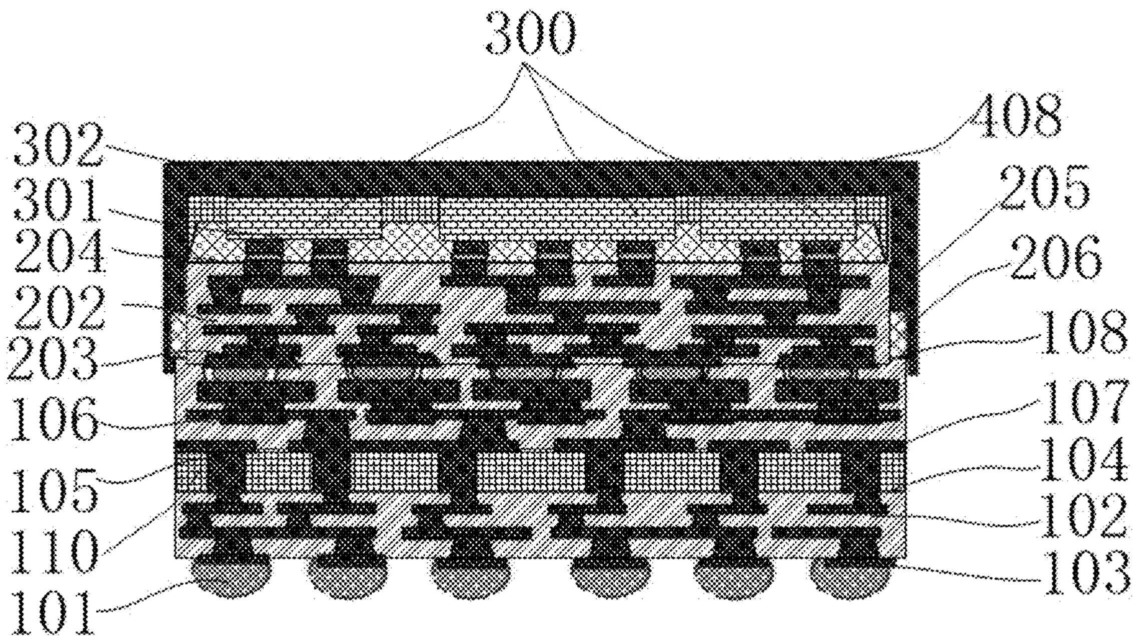
FIG. 23 is a schematic diagram of a fan-out packaging structure with an external heat sink mounted thereto in Embodiment 2 of the present disclosure.

Optionally, as shown in FIG. 23, after filling the first filler layer 206, a heat sink 408 is installed in the periphery of the fan-out packaging structure. Specifically, the heat sink 408 includes one or more of thermally-conductive silicone grease, silicon-based micro channels, heat dissipation patches, and two-phase forced convectors, or other suitable heat sink structures.

In summary, by having a fan-out substrate unit with a double-layer wiring layer as the substrate of the fan-out wiring layer, the present disclosure reduces the minimum line width that can be achieved by the fan-out circuit, thereby increasing the achievable line density of the fan-out package, and reducing the size of the fan-out package. Meanwhile, replacing the traditional substrate with the double-layer wiring layer, and adopting the centralized preparation method for preparing the fan-out substrate unit and the secondary fan-out unit separately and then combining the two, shortens the time required to prepare the whole structure and improves the production efficiency.

Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for manufacturing a fan-out packaging structure, comprising:

providing a first temporary substrate; forming a first separation layer on the first temporary substrate; and forming a second wiring layer on the first separation layer, wherein the second wiring layer comprises a second circuit layer and a second dielectric layer, a second bottom surface and a second top surface opposite to the second bottom surface, wherein the second circuit layer is exposed from the second wiring layer, and wherein the first separation layer is in contact with the second top surface;

forming a plurality of conductive posts over the second bottom surface, wherein bottom surfaces of the plurality of conductive posts are facing away from the second bottom surface; filling gaps between the plurality of conductive posts with a first encapsulation layer; grinding the first encapsulation layer until the bottom surfaces of the plurality of conductive posts are exposed; forming a first wiring layer over the first encapsulation layer, wherein the first wiring layer comprises a first bottom surface and a first top surface opposite to the first bottom surface, wherein an effective electrical connection is formed between the first top surface and the plurality of conductive posts;

disposing a first solder array over the first bottom surface, wherein the first solder array is electrically connected to the first bottom surface; removing the first temporary substrate by removing the first separation layer;

forming an oxidation-resistant layer over the second circuit layer exposed from the second top surface of the second wiring layer, and obtaining a fan-out substrate;

cutting the fan-out substrate to form a plurality of fan-out substrate units;

providing a second temporary substrate, forming a second separation layer on the second temporary substrate; and forming a third wiring layer over the second separation layer, wherein the third wiring layer comprises a third bottom surface and a third top surface opposite to the third bottom surface, and wherein the third bottom surface is in contact with the second separation layer;

removing the second temporary substrate by removing the second separation layer;

forming a second solder array over the third bottom surface, wherein the second solder array is electrically connected to the third bottom surface to obtain a secondary fan-out structure;

cutting the secondary fan-out structure to form a plurality of secondary fan-out units; and fixing and electrically connecting the third bottom surface to the second top surface through the second solder array.

2. The method according to claim 1, further comprising:

after forming the third wiring layer, disposing a semiconductor chip set over the third top surface, wherein the semiconductor chip set comprises one or more chips, a solder surface and an external connection surface, wherein an effective electrical connection between the solder surface and the third top surface is formed by an electrical connection structure;

filling gaps inside the electrical connection structure by a second filler layer;

encapsulating the semiconductor chip set with a second encapsulation layer to form an encapsulation body, wherein the second encapsulation layer encapsulates the third wiring layer, the semiconductor chip set, and the electrical connection structure;

grinding the second encapsulation layer until the external connection surface of the semiconductor chip set is exposed;

forming a third separation layer over the external connection surface, providing a third temporary substrate on the third separation layer;

removing the second temporary substrate by removing the second separation layer;

forming a second solder array over the third bottom surface;

removing the third temporary substrate by removing the third separation layer; and obtaining the secondary fan-out structure.

3. The method according to claim 1, further comprising:

forming a support layer on a side of the first temporary substrate facing away from the second top surface after the first temporary substrate is removed; and after forming the oxidation-resistant layer and cutting the fan-out substrate to obtain the plurality of fan-out substrate units, removing the support layer.

4. The method according to claim 1, further comprising: filling gaps of the second solder array with a first filler layer, wherein the first filler layer encapsulates the second solder array.

* * * * *